United States Patent
Franken et al.

(10) Patent No.: US 7,151,588 B2
(45) Date of Patent: Dec. 19, 2006

(54) LITHOGRAPHIC APPARATUS AND A METHOD OF COMPENSATING FOR THERMAL DEFORMATION IN A LITHOGRAPHIC APPARATUS

(75) Inventors: Dominicus Jacobus Petrus Adrianus Franken, Veldhoven (NL); Wilhelmus Josephus Box, Eksel (BE)

(73) Assignee: ASML Netherlands B.V., Veldhoven (NL)

( * ) Notice: Subject to any disclaimer, the term of this patent is extended or adjusted under 35 U.S.C. 154(b) by 100 days.

(21) Appl. No.: 10/932,303

(22) Filed: Sep. 2, 2004

(65) Prior Publication Data

US 2005/0140950 A1  Jun. 30, 2005

(30) Foreign Application Priority Data

Sep. 4, 2003 (EP) ................................. 03077784

(51) Int. Cl.
*G03B 27/52* (2006.01)

(52) U.S. Cl. .......................... 355/30; 355/53; 355/67; 355/71; 355/77; 378/34; 378/35; 250/492.1

(58) Field of Classification Search ...................... None
See application file for complete search history.

(56) References Cited

U.S. PATENT DOCUMENTS

| 4,825,247 A | 4/1989 | Kemi et al. |
| 4,963,921 A | 10/1990 | Kariya et al. |
| 5,105,075 A | 4/1992 | Ohta et al. |
| 5,581,324 A | 12/1996 | Miyai et al. ................. 355/53 |
| 5,883,704 A | 3/1999 | Nishi et al. |
| 6,842,500 B1 * | 1/2005 | Komatsuda et al. .......... 378/34 |
| 2005/0099611 A1 * | 5/2005 | Sogard ........................ 355/30 |

FOREIGN PATENT DOCUMENTS

| DE | 38 03 738 A1 | 8/1998 |
| EP | 0 678 768 A2 | 10/1995 |
| EP | 1 037 266 A1 | 9/2000 |
| EP | 1 178 357 A1 | 2/2002 |
| GB | 2 321 316 A | 7/1998 |

* cited by examiner

*Primary Examiner*—D. Rutledge
(74) *Attorney, Agent, or Firm*—Pillsbury Winthrop Shaw Pittman LLP (57) ABSTRACT

A lithographic apparatus is disclosed. The apparatus includes an illumination system for providing a beam of radiation, a support structure for supporting a patterning device, a substrate support for supporting a substrate, a projection system for projecting the patterned beam of radiation onto a target portion of the substrate, and a thermal compensation deformation unit for compensating for a deformation of an element caused by a thermal load. The thermal compensation deformation unit includes at least one temperature sensor for sensing a temperature in at least one location on the element, and a processing unit for calculating the deformation of the element caused by the thermal load as a function of the temperature sensed at the location. The deformation is calculated using data from a computer-generated model of the element so that an appropriate correction for the deformation can be made or taken into account.

31 Claims, 4 Drawing Sheets

LITHOGRAPHIC APPARATUS AND A METHOD OF COMPENSATING FOR THERMAL DEFORMATION IN A LITHOGRAPHIC APPARATUS

CROSS-REFERENCE TO RELATED APPLICATIONS

This application claims the benefit of priority from European Patent Application No. 03077784.1, filed Sep. 4, 2003, the entire content of which is incorporated herein by reference.

FIELD

The present invention relates to a lithographic apparatus and a method of compensating for thermal deformation in a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

A lithographic apparatus includes components, such as radiation sources, that generate heat. Other elements in the lithographic apparatus, such as support frames and optical and other elements are subject to a thermal load from the heat generating components. It has been found that the thermal loads experienced by certain elements in the lithographic apparatus compromise the imaging quality of the apparatus. It is an aspect of the present invention to address this problem.

Further, to reduce the size of features that can be imaged using a lithographic apparatus, it is desirable to reduce the wavelength of the illumination radiation. Ultraviolet wavelengths of less than 180 nm are therefore currently used, for example, 157 nm or 126 nm. Also used are extreme ultraviolet (EUV), also referred to as soft x-rays, wavelengths of less than 50 nm, for example, 13.5 nm.

A consequence of using shorter wavelengths is that while thermal stability within the projection system continues to be a problem in lithographic apparatus, it has been found that apparatus operating at shorter wavelengths, such as those less than 180 nm, are even more prone to thermal stability problems than those operating at higher wavelengths.

An apparatus operating at a shorter wavelength is described, for example, in co-owned pending European Patent Application No. 1178357. In EP1178357, a lithographic apparatus is known of which certain components are located in a vacuum chamber. The projection beam images the mask onto the substrate via a number of mirrors. Such an arrangement is needed, for example, when an EUV beam is used, because an EUV projection beam would be unsuitable for projection purposes in gases at atmospheric pressure, and because no refractive optical elements are presently available for EUV radiation. The same arrangements are necessary for other types of beams.

European Patent Application No. 1178357 notes that operation under vacuum may cause temperature stability problems, because heat radiation from the walls of the vacuum chamber or from the vacuum pump may lead to thermal expansion or contraction. This results in imaging errors when temperature critical components like the reference frame, the support frame, the substrate table, or the projection system experience temperature variations.

In particular, thermal stability affects the imaging quality because the position of the optical elements, in particular, the mirrors in EUV lithography projection apparatus, needs to be achieved and maintained during the exposure extremely accurately. For example, in EUV apparatus, the mirrors need to be positioned with an accuracy of +/−0.1 nm or less. Since the optical elements, such as mirrors, are supported on a support frame, it will be understood that temperature variations which cause the support frame to deform may also cause the position of the mirrors to vary.

Conventionally, this problem has been addressed by designing apparatus so that they react as little as possible to thermal variations. For example, by constructing support frames and other critical structures of materials such as ZERODUR® or INVAR®, which are specialty materials referred to in the art as NZTE (near-zero thermal expansion) materials, or the like. Such materials are designed to have very low expansion coefficients. Although the use of these materials improves the thermomechanical stability of the apparatus, they have various drawbacks including cost, manufacturability, and fragility of the materials used, especially ZERODUR®, add to the complexity of the manufacture. Also, connecting glass materials together is problematic, which is one of the factors contributing to the more general problem of manufacturability of NZTE materials, such as ZERODUR®.

A further approach to solving the problem of thermal stability, as for example, described in EP1178357, is to provide a heat shield disposed between heat sources and temperature critical components.

It has been found that in spite of efforts to minimize the effect temperature fluctuations have on the lithographic apparatus operating at any wavelength, this impact cannot be fully eliminated. Further as mentioned above, the materials and techniques used to combat the problem of thermal stability, have their drawbacks that generally add to the complexity and to the cost of the apparatus.

SUMMARY

It is an aspect of the present invention to address the problems encountered in conventional apparatus with respect to thermomechanial stability. It is a further aspect of the present invention to provide an apparatus in which the position of at least one moveable optical element in the projection system is thermomechanically stable.

According to an aspect of the present invention, there is provided a lithographic apparatus that includes an element subject to a thermal load, and a thermal compensation deformation unit for compensating for a deformation of the element caused by the thermal load. The thermal compensation deformation unit includes at least one temperature sensor for sensing a temperature in at least one location on the element, and a processing unit for calculating the deformation of the element caused by the thermal load as a function of the temperature sensed at the location. The deformation is calculated using data from a computer generated model of the element so that an appropriate correction for the deformation can be made or taken into account.

In an embodiment, a lithographic apparatus is provided. The apparatus includes an illumination system for providing a beam of radiation, and a support structure for supporting a patterning device. The patterning device serves to impart the beam of radiation with a pattern in its cross-section. The apparatus also includes a substrate support for supporting a substrate, a projection system for projecting the patterned beam of radiation onto a target portion of the substrate, and a thermal compensation deformation unit for compensating for a deformation of an element caused by a thermal load. The thermal compensation deformation unit includes at least one temperature sensor for sensing a temperature in at least one location on the element, and a processing unit for calculating the deformation of the element caused by the thermal load as a function of the temperature sensed at the location. The deformation is calculated using data from a computer-generated model of the element so that an appropriate correction for the deformation can be made or taken into account.

By sensing the temperature in at least one location, it is possible to compensate for thermal deformation of the element. By providing a deformation compensation unit to compensate, rather than attempt to eliminate deformation of the element caused by temperature fluctuations, it is no longer necessary to manufacture elements in the lithographic apparatus that are subject to a thermal load out of specialty materials, such as an NZTE material, such as ZERODUR®. Instead, less expensive, less fragile, and more easily manufacturable materials may be used. This provides the advantages of reducing the material and manufacturing cost and increasing the manufacturability of certain elements in the lithographic apparatus that are subject to a thermal load. As a result, in a particular embodiment of compensating for a thermal load on a projection system support frame, the thermal stability may be improved so that a positioning accuracy of the moveable optical element supported by the projection system support frame of a fraction of a nanometer over a period of an exposure may be achieved, for example, over several minutes.

In an embodiment, a modeling unit is provided which generates the model using finite element modeling. It has been found that finite element modeling may be used to effectively and accurately model elements made of a homogeneous material, such as ZERODUR® or a metal, for example, INVAR® or aluminium. In an embodiment, the deformation of the structure is measured for several temperature distributions and an experimental fit is used to create the model for the thermal deformation compensation unit.

In an embodiment, the thermal deformation compensation unit further includes a control unit arranged to output a control signal in response to the calculated deformation. The control signal corrects for or takes into account the deformation. By providing a control unit, a direct control loop between the element subject to a thermal load and the temperature sensed at the element is established.

In an embodiment, the temperature sensor is disposed directly on the element. By disposing the temperature sensor directly on the element, the accuracy of the sensed temperature and thus, the compensation of any thermal load may be more accurately sensed and compensated for, respectively.

In an embodiment, the temperature sensor is disposed on at least one of an inside and an outside of the element. By disposing the temperatures sensor on at least one of an inside and an outside of the element, the accuracy of the sensed temperature of the element, and thus, the compensation of any thermal load may be even more accurately sensed and compensated for, respectively.

In an embodiment, the element is a support frame. By compensating for thermal deformations in the support frame, whereas previously, such support frames were necessarily made of expensive, specialist materials, in accordance with the present invention, other less expensive materials, such as metals, such as INVAR® and aluminium, may be used as materials for a support frame. By providing a support frame of a metal such as INVAR® or aluminium, benefits in the field of dynamics may be obtained. The frame may be less fragile, the manufacturability of the support frame may be improved, the connection technology, i.e., the ability to be able to connect different components to one another, may be simplified, and the freedom to design the support frame may be increased. Further, the cost and the lead time of the frame may be reduced. Further, it has been found that homogeneous materials, such as metals, may be accurately and effectively modeled using finite element modeling according to an embodiment of the present invention.

In an embodiment, the support frame is a source frame for supporting a source of radiation, or an illuminator frame for supporting an illumination system, or a patterning device support frame for supporting a patterning device, or a projection system support frame for supporting a projection system, or a first reference support frame for supporting at least one of the projection system support frame and a measurement system, or a second reference support frame for supporting the first reference support frame, or a substrate support frame for supporting a substrate, or any combination thereof. In this way, the present invention has application to various elements in the lithographic apparatus.

In an embodiment, the element is an optical element and/or an element included in a measuring system. In this way, in addition to support frames, the present invention may be applied to optical elements, such as mirrors and lenses, and elements in a measuring system, such as mirror blocks.

In an embodiment, the further element is a moveable optical element supported on the support frame, and the control signal causes the position of the further moveable optical element to be adjusted so as to compensate for the deformation of the element, in response to the at least one temperature sensed by the at least one sensor. In this way, rather than having to ensure that the support frame deforms a minimum amount, account for any deformation may be made by the optical elements. Thus, the manufacturing tolerances may be reduced. At the same time, the accuracy of the system, for example, the illumination system or projection system, in which the moveable optical elements are disposed may be improved.

In an embodiment, at least one temperature sensor is directly disposed on the support frame and the optical element, wherein the position of the optical element is determined by the temperatures sensed by the temperature sensors disposed on the support frame and the optical element. By measuring the temperature directly on the support frame and the optical element, the accuracy of the compensation for the thermal deformation of the structure may be further improved.

In an embodiment, the processing unit, responsive to the sensor, provides a deformation signal indicative of the deformation. The processing unit derives the deformation signal on the basis of deformation data and the sensed temperature, and the deformation data is derived from the model and represents the deformation of the frame as a function of temperature at the at least one location. By providing a deformation signal derived from the sensed temperature and deformation data, an accurate assessment of the deformation may be achievable, which may provide an accurately determined deformation signal to the adjustment unit.

In an embodiment, the apparatus includes at least one of an illumination system for providing a projection beam of radiation, and a support structure for supporting a patterning device, the patterning device serving to impart the projection beam with a pattern in its cross-section, a substrate table for holding a substrate, and a projection system for projecting the patterned beam onto a target portion of the substrate.

In an embodiment, the deformation data is in the form of a thermal deformation model. By providing the deformation data in the form of a thermal deformation model, deformation data may be provided relating to several parameters and operating conditions of the apparatus. Thus, further increasing the accuracy with which deformation of the support frame may be compensated for.

In an embodiment, the thermal compensation deformation unit compensates for a thermal effect on a structure of the element. In this way, the thermal effect of the structure itself may be compensated for.

In an embodiment, the temperatures sensor is located at a location where the structure of the element has a high stiffness. It has been found that temperature sensors placed at locations where the structure has a high stiffness provide particularly good results, since the temperature at these locations dominates the thermo-mechanical behaviour of the total structure.

According to a further aspect of the present invention, there is provided a method of compensating for thermal deformation in a lithographic apparatus. The lithographic apparatus includes an element subject to a thermal load. The method includes sensing a temperature in at least one location on the element, calculating a deformation of the element caused by the thermal load as a function of the temperature sensed at the at least one location using data from a computer generated model of the element, and compensating for the deformation of the element.

According to a yet further aspect of the present invention, there is provided a user terminal that includes a device operable to perform a method that includes sensing a temperature in at least one location on an element, calculating a deformation of the element caused by the thermal load as a function of the temperature sensed at the at least one location using data from a computer generated model of the element, and compensating for the deformation of the element.

According to a yet further aspect of the invention, there is provided a computer readable storage medium storing a program, which when run on a computer controls the computer to perform a method that includes sensing a temperature in at least one location on an element, calculating a deformation of the element caused by the thermal load as a function of the temperature sensed at the at least one location using data from a computer generated model of the element, and compensating for the deformation of the element.

According to another aspect of the invention, there is provided a thermal compensation deformation unit for compensating for a deformation of an element caused by a thermal load. The thermal compensation deformation unit includes at least one temperature sensor for sensing a temperature in at least one location on the element, and a processing unit for calculating the deformation of the element caused by the thermal load as a function of the temperature sensed at the location. The deformation is calculated using data from a computer-generated model of the element so that an appropriate correction for the deformation can be made or taken into account. In an embodiment, the element is located in a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" as used herein encompass all types of electromagnetic radiation, including ultra-violet (UV) radiation (e.g. having a wavelength of 365, 355, 248, 193, 157 or 126 nm) and extreme ultra-violet (EUV) radiation (e.g. having a wavelength in the range of 5–20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems. The lithographic apparatus may also be of a type of a flat panel display.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
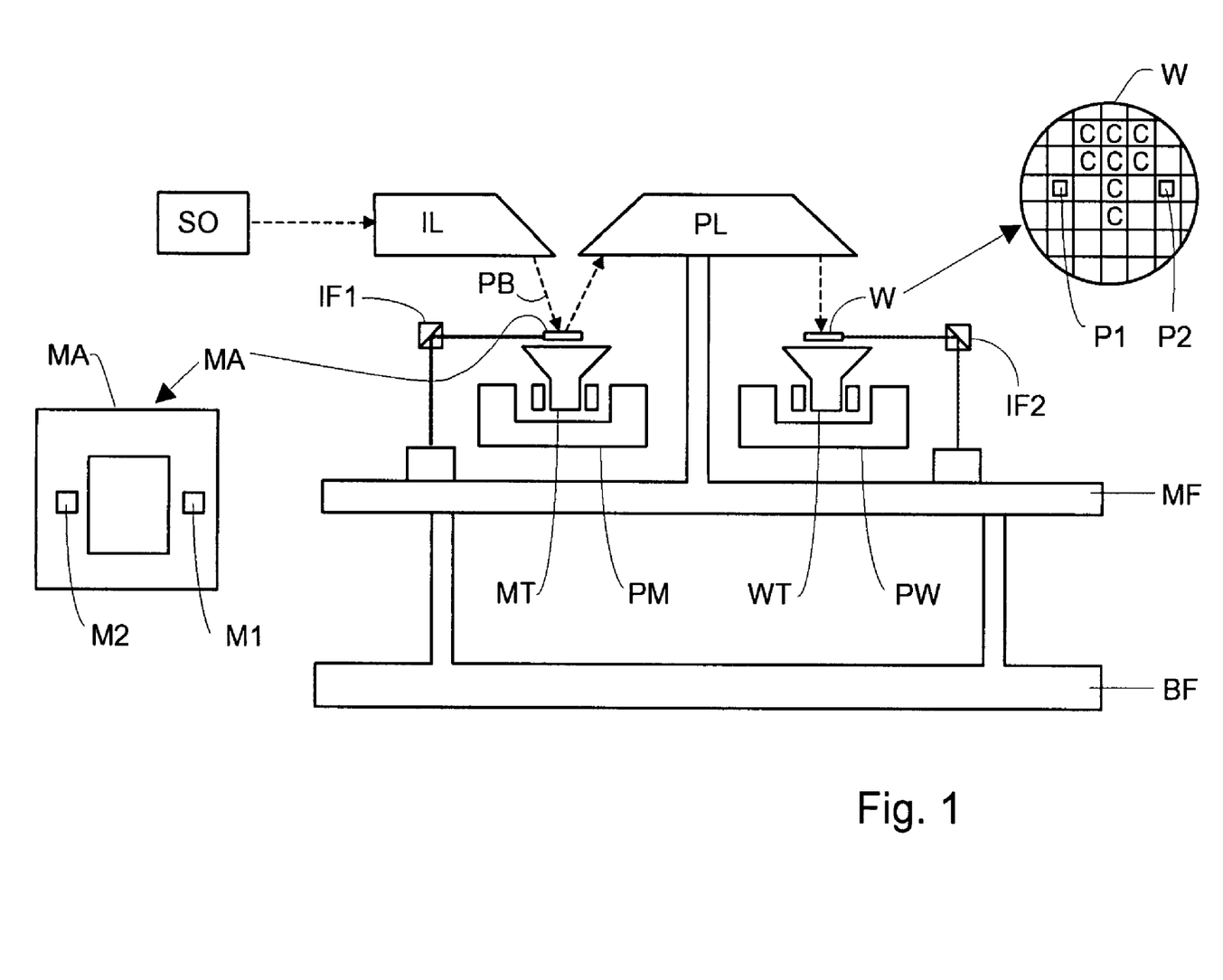
FIG. 1 depicts a lithographic apparatus according to an embodiment of the invention.

FIG. 1 schematically depicts a lithographic apparatus according to a particular embodiment of the invention. The apparatus includes an illumination system (illuminator) IL for providing a projection beam PB of radiation (e.g. UV or EUV radiation), a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including for example suitable collecting mirrors and/or a spectral purity filter. In other cases, the source may be integral part of the apparatus, for example, when the source is a mercury lamp. The source SO and the illuminator IL, may be referred to as an illumination system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator IL provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner), the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

In lithographic apparatus operating at certain wavelengths, for example, EUV, alpha and gamma radiation, certain apparatus components, for example, the projection system, the illuminator, the mask and mask table, and the wafer and wafer table, are disposed in a vacuum chamber, which is pumped out using a vacuum pump. While the present invention has particular application to those apparatus having components in a vacuum chamber because it has been found that the vacuum pump increases the thermal instability of lithographic apparatus, the present invention also has application to other lithographic apparatus not including a vacuum chamber and pump, since thermal instability continues to be a problem in these apparatus.

Figure 2:
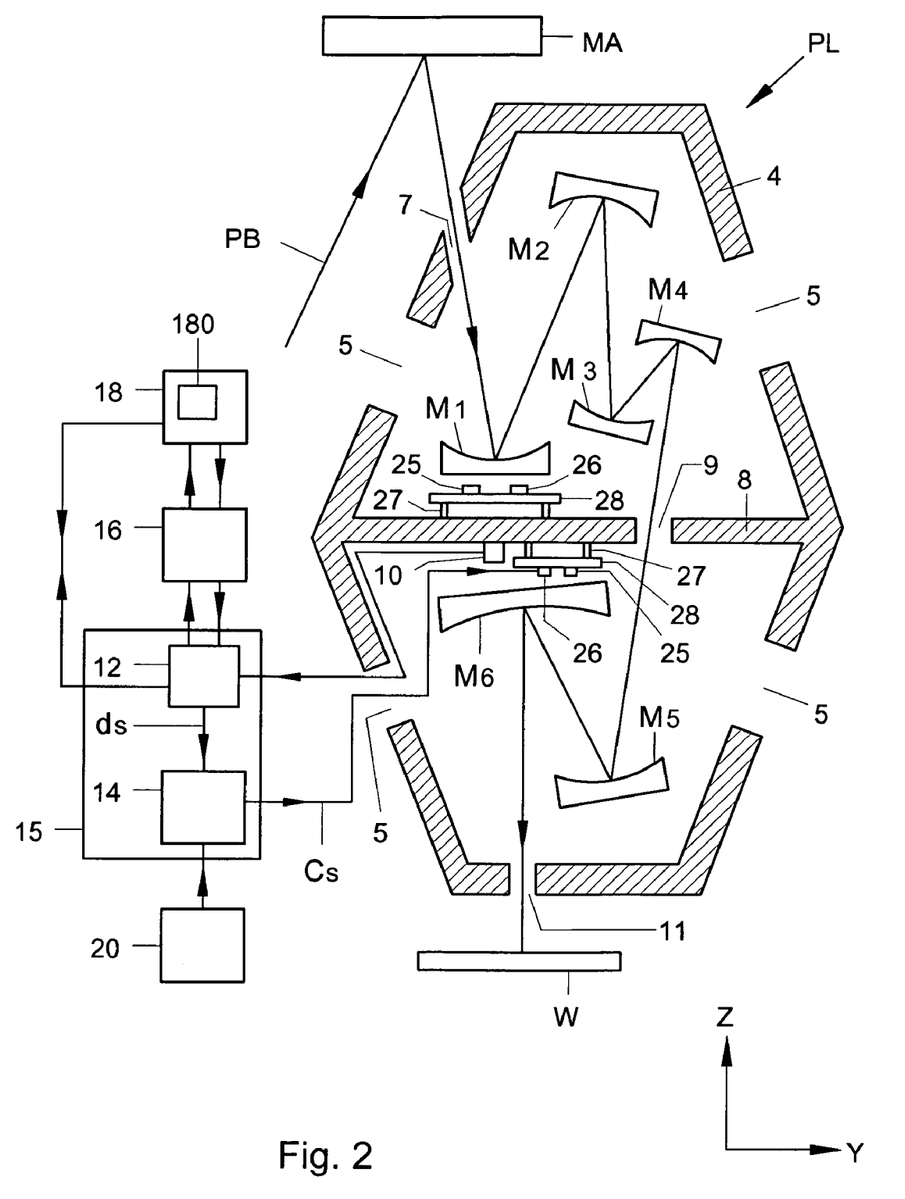
FIG. 2 depicts details of a lithographic apparatus including a temperature deformation compensation circuit according to an embodiment of the present invention.
Figure 3A:
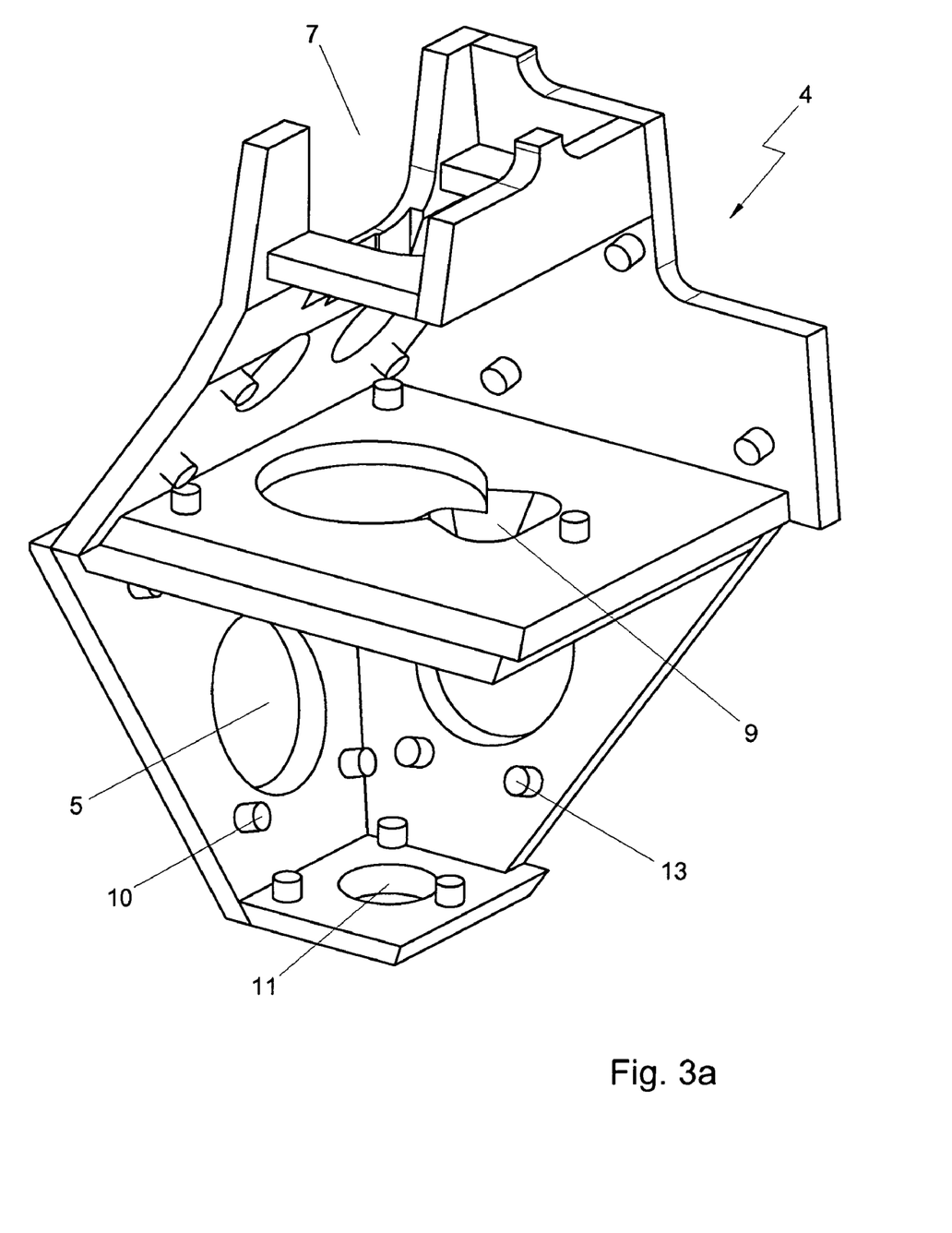
FIGS. 3a and 3b depict a support frame on which a plurality of sensors are disposed.
Figure 3B:
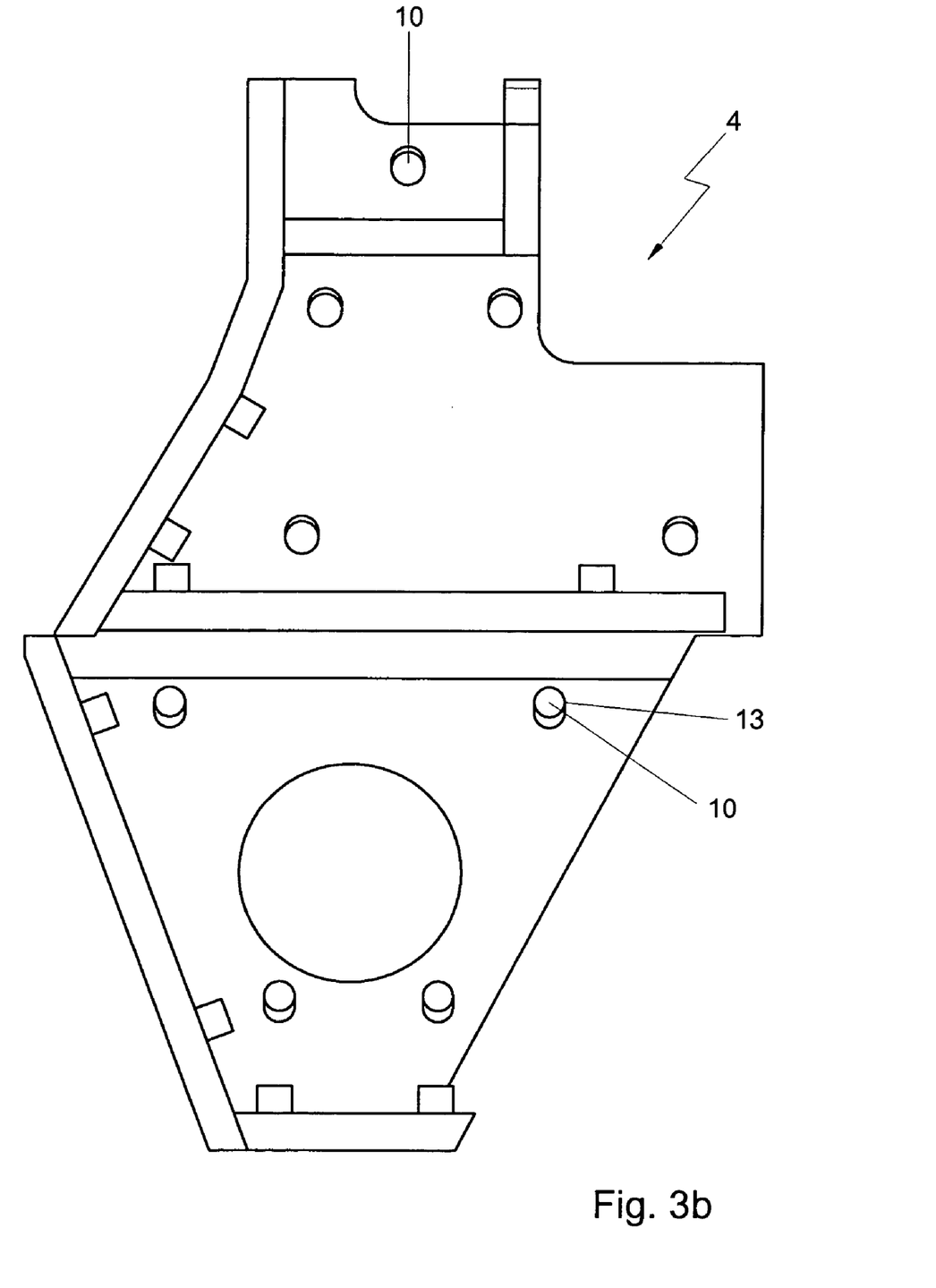

The present invention has application to many elements within a lithographic apparatus. With reference to FIGS. 2–3b, a particular embodiment is described with respect to the compensation of thermal deformation within the projection system is described. However, the invention is not limited in this respect. The invention is applicable to any support frame in the lithographic apparatus, as well as other elements in a lithographic apparatus, such as optical elements, which may be moveable, such as mirrors and lenses, and also other elements in the measuring systems IF1, IF2, such as the mirror blocks.

For example, elements whose thermal deformations may be compensated for include, but are not limited to a source frame for supporting the source of radiation SO, an illuminator frame for supporting the illumination system IL, a patterning device support frame MT for supporting a patterning device MA, a projection system support frame for supporting a projection system PL, a first reference support frame MF for supporting at least one of the projection system support frame and a measurement system IF1, IF2, a second reference support frame BF for supporting the first reference support frame MF and a substrate support frame WT for supporting a substrate WA. It is noted with respect to the schematic nature of FIG. 1, that the support frames recited above, where not indicated specifically in FIG. 1, are considered to form a part of the source SO, the illumination system IL, and the projection system PL, respectively. As mentioned, by compensating for thermal deformations in elements subject to a thermal load, alternative materials for the elements may be used. For example, at least one of the first reference support frame MF and the second reference support frame BF may be made of at least one of INVAR® and aluminium. It is noted that in the art, the first reference support frame MF may be referred to as the metrology (or metro) frame and the second reference support frame BF may be referred to as the base frame.

In an embodiment, a control signal is output to a further element in the apparatus causing the further element to correct for or take into account the deformation. In an embodiment, the further element is supported on the element. In an embodiment, the control signal takes into account the deformation in a set point for the control of the further element. In an embodiment, the control signal is output to a further element in the apparatus causing the further element to correct for or take into account the deformation. The further element may be, for example, an optical element, such a mirror or a lens. The further elements may be moveable. In one embodiment, the control signal causes the further element to move in response to the deformation calculated by the thermal deformation compensation unit. As described with reference to FIGS. 2 to 3b, the further element may be supported on the element. Thus, any deformation of the element is compensated for by controlling the further element, by for example, moving the further element to compensate for the deformation of the element. In an embodiment, the control signal takes into account the deformation in a set point for the control of the further element.

FIG. 2 depicts details of a lithographic apparatus, including a temperature deformation compensation circuit according to an embodiment of the present invention. The embodiment of the invention shown in and described with reference FIG. 2, is with respect to the projection system PL and the projection system support frame 4. However, as discussed above, the invention is not limited to this example, and may be applied to those further situations described above with reference to FIG. 1. For those elements having the same reference numeral as an element shown and described with reference to FIG. 1, FIG. 1 is referred to. The projection system PL typically includes an element 4. The element shown in FIG. 2 is a support frame, in particular, the projection system support frame. The projection system PL further includes a plurality of further elements. In FIG. 2, the further elements M1–M6 are a plurality of optical elements M1–M6. The optical elements shown in the embodiment shown in FIG. 2 are mirrors. At least one of the mirrors is arranged to be moveable. Typically, all the mirrors except mirror M5 are moveable. The mirrors are arranged to direct the patterned beam from the mask to the wafer. As mentioned, the accuracy with which the mirrors are positioned is extremely high. The position of the mirrors is controlled by control unit 14. A position sensor 25 is provided to determine the position of the mirror. An actuator 26 is adapted to receive a control signal Cs from the control unit 14 and causes the mirror to move to a desired position in response to the control signal Cs. The mirrors M1–M6 are provided in a support frame 4. The support frame 4 may include a reference frame 4 and a plurality of sensor frames 28. The plurality of sensor frames 28 are adapted to be mounted in the reference frame 4 using interfacing elements 27. The sensor frame 28 is a frame adapted to support an optical element M1–M6, typically a moveable mirror, the position sensor 25, and the actuator 26. A separate sensor frame 28 may be provided for each mirror M1–M6. Typically, however, a separate mirror module is provided for M1–M4 and M6. M5 is typically stationary, and mounted directly to the support frame 4. Typically, the mirror M5 is not provided with sensors or actuators. Such a sub-assembly is conventionally referred to as a "mirror module". The mirrors may be in thermal contact with the support frame. In particular, any thermal instability of the support frame affects the optical elements.

In FIG. 2, for the sake of simplicity, only two sensor frames are shown. However, typically all movable mirrors are supported on their own sensor frame 28. Conventionally, each sensor frame 28 is mounted in the reference frame 4 using a so called "statically determined interface" 27. Such an interface may include, for example, a plurality of elements 27 (of which only a few are shown in FIG. 2), which are disposed to mount the mirror module in the reference frame 4 in such a way that each element 27 constrains only once each of the six degrees of freedom. In FIG. 2, the support of the mirrors on the support frame is schematically represented by rods 27 supporting mirrors M1 and M6. Mirrors M2–M4 are typically also supported in a similar way, although for the sake of simplicity in FIG. 2, the support members 27 are only shown for mirrors M1 and M6. Typically M5 is stationary, thus, its support members differ from those for M1–M4 and M6. Although, the "statically determined interface" as described with reference to FIG. 2 represents one conventional way of mounting a mirror in a support frame, the present invention is not limited in this respect, and is suitable for application in any apparatus where one moveable optical element is supported on a support frame independent of the nature of the support member. Since the optical elements (mirrors) are supported in the support frame 4, it will be understood that a deformation in the support frame caused by temperature fluctuations in the lithographic apparatus may cause the position of the mirror to change.

To address this problem, a thermal deformation compensation unit 10, 15 is provided. The thermal deformation compensation unit 10, 15 includes at least one temperature sensor 10 to sense the temperature in at least one location on the frame 4. In FIG. 2, one temperature sensor 10 is shown in the vicinity of mirror M6. However, any number of sensors may be provided over the support frame 4. The total number of sensors may be approximately 50, however, this is not intended to be limiting in any way. Although, the location of each sensor is not critical to the invention, in a particular embodiment, sensors 10 are provided in the vicinity of mirrors M1–M6, in particular in those areas where the sensor frame comes into contact with the reference frame. In alternative embodiments, where the optical elements are mounted in alternative ways in a support frame 4, the temperature sensors may be located at those locations where the optical elements are supported on the frame by alternative mounting or supporting elements. For situations where no sensor frames are provided, for example, for embodiments where the mirror position sensors are mounted directly onto the support frame, a temperature sensor is located at the same position as the mirror position sensor, as this position sensor determines the position of the optical element, that is the mirror. Further, sensors may also be disposed at locations where deformation is known to occur, since even deformation at a location relatively remote from an optical element may have an impact on the position of an optical element.

In an embodiment, it has been found that temperature sensors placed at locations where the structure has a high stiffness provide particularly good results, since the temperature at these locations dominates the thermo-mechanical behavior of the total structure. In an embodiment, the temperature sensors are disposed on both the support frame and the optical elements. In this way, the accuracy of the compensation may be further improved. The manner in which the present invention compensates for a given deformation due to the temperature at a particular location is discussed in more detail below.

The support frame 4 provides a frame on which the optical elements M1–M6 are provided. Typically, the support frame 4 is a housing. The projection beam PB enters the housing via an opening or window 7 formed in the housing and leaves the housing via an opening or window 11. The housing may also include a stiffening plate 8 disposed across the middle of the housing. In this particular embodiment, a further opening or window 9 is provided in the stiffening plate 8 to allow the projection beam PB to propagate through the housing. The support frame 4 may be made of low expansion materials. However, the invention allows the use of other materials, including metals for the support frame 4. In an embodiment, the support frame 4 includes INVAR®. The support frame may alternatively include other metals, such as aluminium or ceramic materials. In general, the invention is independent of the material choice.

In order to be able to sufficiently calculate the model for the thermal deformation, the mathematical representation of the thermal properties and behavior of the material should approximate reality as close as possible. Alternatively, for example, for exotic and/or anisotropic materials, the thermal deformation model may be determined experimentally, for example, by measuring the deformation of this structure for several temperature distributions and fitting a thermal deformation model in the experimental data, for example, by regression analysis. Also, of course, the temperature measurement should be accurate enough. Various materials are known whose behavior is more or less linear, i.e., they have thermal expansion coefficients, and thermal conductivity coefficients that are more or less constant in time and as function of the absolute temperature, at the very least, in the temperature range over which a lithographic apparatus functions, i.e., from around 20 degrees Celsius to around 30 degrees Celsius. However, in general, even if temperature behavior is non-linear, provided it is known to a certain degree, deformation may still be predicted accurately enough to be compensated for sufficiently. In general, the invention is not limited to materials with linear material properties. However, if material properties are linear, it suffices to measure temperature differences within a certain amount of time, instead of absolute temperatures. Also, materials with high thermal expansion coefficients require a more accurate measurement of temperature changes to be able to achieve that optical image distortion or measurement errors leading to loss of overlay and focus due to finite compensation of deformation of the support frame remains within a certain limit. Thus, in general, materials with all kinds of thermal expansion coefficients are allowed. However, the higher the thermal expansion coefficient, the more accurate the measurement of the temperature and/or temperature changes may be.

With respect to aluminium, it is commented that its coefficient of thermal expansion is quite high, typically 20 to 40 times higher than INVAR®. Therefore, the amount thermal deformation to be compensated for is increased with respect to an INVAR® support frame. However, the aluminium provides benefits such as a relatively low cost, easy manufacturability, and robustness. Furthermore, aluminium has a very high thermal conductivity and specific heat, leading to lower and more uniform change in temperatures, which again lead to a more uniform deformation and, therefore, a simpler thermal deformation model. As with INVAR®, aluminium can exploit well known "connection technology", and there is large scope for design freedom.

Further, for aluminium, the ratio of density to Young's Modulus (rho/E) is almost equal to that of ZERODUR®. The ratio of density to Young's Modulus is a known measure used to determine the difficulty of achieving a desired dynamic behavior.

In an alternative embodiment, a support structure including a ceramic material may be provided. The choice of ceramic material may be made from various available ceramics. Ceramic materials exhibit a wide range of appropriate properties, such as toughness, coefficient of thermal expansion, conduction, and the ratio of density to Young's Modulus (rho/E).

Returning to FIG. 2, in embodiments in which the lithographic apparatus operates at EUV and other wavelengths, and where the projection system PL is disposed in a vacuum chamber, openings 5 are provided in the frame though which a vacuum pump (not shown) evacuates the space enclosed by the support frame 4.

The thermal deformation compensation unit 10, 15 includes at least one temperature sensor 10 which is disposed on, in or in the vicinity of the support frame 4. The temperature sensor 10 generates a signal indicative of the temperature at a particular location. The temperature sensor 10 is connected to the adjustment unit 15. The adjustment unit 15 includes a processing element such as a processing unit 12 and a control unit 14. The processing unit 12 is part of a control loop that includes the control unit 14 for generating a control signal Cs. Also provided is a storage unit 16 for storing data generated by a modeling unit 18, to which the processing unit 12 has access. The modeling unit 18 generates data indicative of the deformation at a particular location caused by the temperature at the location to which the processing unit 12 and the storage unit 16 have access. In addition to receiving data from the processing unit 12, the control unit 14 may also receive input from other control circuits 20 of the lithographic apparatus.

The elements included in the control loop may be connected by electrical wires or other elements, such as optical elements including optical fibers or planar waveguides. Alternatively, they may be connected by other elements, such as an IR link, where a line of sight connection is required between the temperature sensor and at least one component of the adjustment unit 15, such as the processing unit 12. Where the control loop elements of the adjustment unit 15 are connected to the temperature sensor or sensors 10 via electrical wires or other means, such as optical fibers, or an IR link, the connection may be conveniently fed or established through existing openings formed in the support frame 4, such as openings 5. Thus, the mechanical stability of the support frame 4 is not compromised or the manufacture complicated by the formation of additional holes or features in the support frame 4. The data transfer may also take place via other wireless devices.

The elements of the control loop, including the adjustment unit 15, may be disposed locally in the lithographic apparatus, or in the vicinity of the lithographic apparatus. Alternatively, they may be disposed at a remote location, for example, at a remote control location. In particular, it is envisaged that the modeling unit 18 and storage unit 16 may be disposed at a location remote from the lithographic apparatus. In such an embodiment, the processing unit 12 is adapted to gain remote access to the storage unit 16 and modeling unit 18.

The processing unit 12 is adapted to receive the signal generated by a particular temperature sensor 10. In one embodiment, the signal generated by a particular temperature sensor 10 also includes a component that identifies the location of the sensed temperature to the processing unit 12. Alternatively, the processing unit 12 includes an addressable memory, which enables a particular sensed temperature to be associated at the processing unit 12 with the particular location for which the sensed temperature is associated. Having identified the location of the sensing and the temperature, the processing unit 12 gains access to storage unit 16. In the storage unit 16, data describing the mechanical behavior of the support frame 4 as a function of temperature is stored. In particular, the storage unit 16 stores the deformation data at a particular location as a function of temperature. For a particular temperature reading at a particular location, in particular, the location or locations where an optical element is either directly or indirectly in contact with the support frame 4, the processing unit 12 calculates the deformation of the frame 4 based on model calculations carried out previously. Thus, the corresponding deformation data for a particular location is obtained.

The deformation data is provided to the storage unit 16 by a modeling unit 18. The modeling unit 18, which may also be in direct connection with the processing unit 12, produces a computer generated model of the support frame 4 over its surface as a function of temperature. It has been found that a construction made from a homogeneous material, such as metal, including INVAR® and aluminium, may be modeled particularly well using finite element modeling. Thus, depending on the number of sensors, it is possible to calculate the deformation of the support frame 4 as a function of the temperature measured at several places on the inside and the outside of the support frame 4. Based on the data available to the processing unit 12, the processing unit 12 generates a deformation compensation signal ds, which is indicative of the deformation caused by the sensed temperature at a particular location. The deformation compensation signal ds is provided to the control unit 14, which in response to the deformation compensation signal, and any other control signals it may receive from other control units 20, generates a control signal Cs. The control signal Cs generated by control unit 14 thus takes into account any deformation in the set point for the position control loops of the optical elements of each "mirror module". The control signal Cs is applied to the optical element, for example, via actuator 26, to cause the position of the optical element to be changed in accordance with the control signal Cs.

In a particular embodiment, a computer including units/elements 12, 14, 15, 16, 18 is provided, containing a mathematical model 180 that describes thermal behavior of the support frame 4. Using this model 180, it is possible to predict distortion of the frame 4 as a function of either absolute or relative temperatures at a number of positions. Distortion is understood to mean displacement of one frame point with respect to another point. The model 180 is determined, for example, during the design process of the support frame 4 of the projection optics assembly PL. Alternatively, it may include a number of values to be supplied and/or adjusted for each support frame 4, or each generation of support frames. It is also envisaged that the model 180 may be fine tuned for each projection box assembly PL. This may be carried out, either manually or automatically, during assembly of the exposure unit. It is further envisaged that the fine tuning may be repeated intermittently, for example, every few months, or after an appropriate determined intervals. Again, this fine tuning may be carried out manually or automatically. Automatic tuning, or self-calibration, is possible by measuring actual temperatures of the support frame 4, while at the same time measuring the actual optical image at wafer side, and calculating its distortions, for example, using an interferometric technique.

The input for the model 18 may be absolute or relative temperatures, measured at a plurality of locations by temperature sensors 10. Based on these values, this mathematical model 180 calculates a distortion. The accuracy of the calculated distortion will depend on the accuracy of the mathematical model and the accuracy of the measured temperatures. Using the calculated distortion values, mirror displacements that would have been caused by the distortion are calculated. Then, displacements required by actuators 26 to counteract those mirror displacements are calculated. Finally, those latter displacements to compensate for, and preferably eliminate mirror displacements from support frame distortions, are executed by actuators 26.

In an embodiment, the adjustment unit 15 includes the central processing unit (CPU) 12 of a computer and the computer output 14. The storage unit 16 includes a computer memory. The modeling unit 18 includes the mathematical model 180 stored in the computer. The other control circuit 20 includes an external input. As well as the computer being separate from the lithographic apparatus, it is envisaged that the computer does not necessarily include a separate computer. In such an embodiment, the computer model 18 and all required software is part of the "machine software". Preferably, the computer uses the SUN® computer platform that runs the exposure unit. Alternatively, it may be a dedicated satellite processing unit, of which there are a plurality distributed through the exposure units. This dedicated processing unit with its RAM may be located near the thermal deformation compensated structure, or be part of the thermal deformation compensated structure assembly. Preferably, however, it communicates with the main machine software, receiving, for example, set points, instructions, values, timings and data from other units, and uploading loggings, status, calibration results, etc. Access to, and interfacing with the model, its numerical values, its activities, etc. may be carried out using a user interface terminal provided with each exposure unit.

FIGS. 3a and 3b depict a support frame 4 on which a plurality of temperature sensors 10 are disposed. FIG. 3a shows a support frame 4 in three dimensions, in which the forward facing outer walls of the support frame 4 have been omitted to show the interior of the support frame 4. FIG. 3b shows a plan view of one side of the exterior facing wall of the support frame. As mentioned, the temperature sensors 10 may be disposed on the inside or the outside of the support frame 4, or both. Furthermore, the temperature sensors 10 may be located on top of the material but also inside the material since this provides a particularly accurate reading. The distribution of the sensors 10 and their exact numbers are not critical to the invention. However, the greater the number of sensors 10, the more accurately the deformation can be assessed, and thus compensated for. The sensors 10 may measure temperatures with a resolution of at least 0.1 mK, and in addition to being suitable to non-vacuum conditions, are suitable for use in those conditions found in evacuated chambers. It is commented that the absolute accuracy of the sensors 10 is not essential. The sensors 10 are small and simple components, which do not add greatly to the complexity of the frame 4 and do not compromise the function or manufacturability of the support frame 4. Optionally, a shield 13 may be provided around the sensor 10 to protect it from any effects of the projection beam. Since the projection beam is directed through the frame 4 by mirrors, it is unlikely that any substantial amount of radiation should be incident on the sensors 10, since the sensors 10 are disposed on the support frame, which is not in the propagation path of the projection beam PB. However, since scatter causes a certain amount of light to be reflected at all angles, the shields 13 protect the sensors 10 from any scattered light.

The deformation compensation processing may be carried out at particular time intervals while the apparatus is operational. Alternatively, it may be carried out continuously over a particular time duration, for example, during an exposure.

It has been found that using the present invention is 90–98% effective in compensating for deformation in the support frame caused by temperature fluctuations, which represent a gain factor of 10 to 50. Thus, the thermal demands on the material the frame is made of may be relaxed to an equal extent to achieve at least a comparable thermal stability with conventional frames. Thus, the choice of materials open for consideration for the support frame is greatly increased to, for example, metals such as INVAR® and other materials, as discussed above.

While specific embodiments of the invention have been described above, it will be appreciated that the invention may be practiced otherwise than as described. The description is not intended to limit the invention.

What is claimed is:

1. A lithographic apparatus comprising:
an illumination system for providing a beam of radiation;
a support structure for supporting a patterning device, the patterning device serving to impart the beam of radiation with a pattern in its cross-section;
a substrate support for supporting a substrate;
a projection system for projecting the patterned beam of radiation onto a target portion of the substrate; and
a thermal compensation deformation unit for compensating for a deformation of an element caused by a thermal load, the thermal compensation deformation unit comprising
at least one temperature sensor for sensing a temperature in at least one location on the element; and
a processing unit for calculating the deformation of the element caused by the thermal load as a function of the temperature sensed at the location,
wherein the deformation is calculated using data from a computer-generated model of the element so that an appropriate correction for the deformation can be made or taken into account, and
wherein said element is a support frame, an optical element, or an element comprised in a measuring system.

2. An apparatus according to claim 1, further comprising a modeling unit for generating the model of the element.

3. An apparatus according to claim 2, wherein the modeling unit uses a model generated by finite element modeling or by an experimental fit.

4. An apparatus according to claim 1, wherein the thermal deformation compensation unit further comprises a control unit arranged to output a control signal in response to the calculated deformation, wherein the control signal corrects for or takes into account the deformation.

5. An apparatus according to claim 4, wherein the control signal is output to a further element in the apparatus, thereby causing the further element to correct for or take into account the deformation.

6. An apparatus according to claim 5, wherein the further element is supported on the element.

7. An apparatus according to claim 5, wherein the control signal takes into account the deformation in a set point for the control of the further element.

8. An apparatus according to claim 5, wherein the further element is a moveable optical element supported on the element, and that the control signal causes the position of the moveable optical element to be adjusted so as to compensate for the deformation of the element, in response to the at least one temperature sensed by said at least one sensor.

9. An apparatus according to claim 8, wherein at least one temperature sensor is directly disposed on the element and the optical element, wherein the position of the optical element is determined by the temperatures sensed by the temperature sensors disposed on the element and the optical element.

10. An apparatus according to claim 1, further comprising a storage unit for storing the computer-generated model.

11. An apparatus according to claim 1, wherein the at least one temperature sensor is disposed directly on the element.

12. An apparatus according to claim 11, wherein the at least one temperature sensor is disposed on an inside and/or an outside of the element.

13. An apparatus according to claim 1, wherein the element is said support frame.

14. An apparatus according to claim 13, wherein the support frame is a source frame for supporting a source of radiation, or an illuminator frame for supporting the illumination system, or the support structure for supporting the patterning device, or a projection system support frame for supporting the projection system, or a first reference support frame for supporting the projection system support frame and/or a measurement system, or a second reference support frame for supporting the first reference support frame, or the substrate support for supporting the substrate, or any combination thereof.

15. An apparatus according to claim 14, wherein the first reference support frame and/or the second reference support frame is made of INVAR® and/or aluminium.

16. An apparatus according to claim 14, wherein the projection system support frame supports a plurality of optical elements including at least one moveable optical element, the plurality of optical elements being disposed in the frame in a spaced relationship, wherein the thermal deformation compensation unit comprises an adjustment unit for adjusting the position of at least one of the plurality of moveable elements in response to the sensed temperature.

17. An apparatus according to claim 1, wherein the element is said optical element and/or said element comprised in a said measuring system.

18. An apparatus according to claim 1, wherein the processing unit, responsive to the sensor, provides a deformation signal indicative of the deformation, wherein the processing unit derives the deformation signal on the basis of deformation data and the sensed temperature, wherein the deformation data is derived from the model and represents the deformation of the element as a function of temperature at the at least one location.

19. An apparatus according to claim 1, wherein the thermal compensation deformation unit compensates for a thermal effect on a structure of the element.

20. An apparatus according to claim 1, wherein the at least one temperatures sensor is located at a location where the structure of the element has a high stiffness.

21. A method of compensating for thermal deformation in a lithographic apparatus, said lithographic apparatus comprising an element subject to a thermal load, wherein the element is a support frame, an optical element, or an element comprised in a measuring system, the method comprising:
sensing a temperature in at least one location on the element;
calculating a deformation of the element caused by the thermal load as a function of the temperature sensed at the at least one location, wherein the deformation is calculated using data from a computer generated model of the element or by an empirical thermal deformation model; and
compensating for the deformation of the element.

22. A method according to claim 21, further comprising modeling the element using a computer to generate the model of the element as a function of temperature.

23. A method according to claim 22, wherein the modeling includes finite element modeling and/or empirical modeling.

24. A method according to claim 21, further comprising outputting a control signal in response to the calculated deformation, wherein the control signal corrects for or takes into account the deformation.

25. A method according to claim 24, wherein the control signal is output to a further element in the apparatus causing the further element to correct for or take into account the deformation.

26. A method according to claim 21, wherein the element supports a plurality of moveable elements disposed on the element in a spaced relationship, the method further comprising adjusting the position of at least one of the plurality of moveable elements in response to the sensed temperature.

27. A method according to claim 21, further comprising disposing at least one temperature sensor on the element.

28. A user terminal comprising a device operable to perform a method, the method comprising:
sensing a temperature in at least one location on an element subject to a thermal load, said element being a support frame, an optical element, or an element comprised in a measuring system;
calculating a deformation of the element caused by the thermal load as a function of the temperature sensed at the at least one location, wherein the deformation is calculated using data from a computer generated model of the element or by an empirical thermal deformation model; and
compensating for the deformation of the element.

29. A computer readable storage medium storing a program which when run on a computer controls the computer to perform a method comprising:
sensing a temperature in at least one location on an element subject to a thermal load, said element being a support frame, an optical element, or an element comprised in a measuring system;
calculating a deformation of the element caused by the thermal load as a function of the temperature sensed at the at least one location, wherein the deformation is calculated using data from a computer generated model of the element or by an empirical thermal deformation model; and
compensating for the deformation of the element.

30. A thermal compensation deformation unit for compensating for a deformation of an element caused by a thermal load, the element being a support frame, an optical element, or an element comprised in a measuring system, the thermal compensation deformation unit comprising
at least one temperature sensor for sensing a temperature in at least one location on the element; and a processing unit for calculating the deformation of the element caused by the thermal load as a function of the temperature sensed at the location,
wherein the deformation is calculated using data from a computer-generated model of the element so that an appropriate correction for the deformation can be made or taken into account.

31. A thermal compensation deformation unit according to claim 30, wherein the element is comprised in a lithographic apparatus.

* * * * *